United States Patent
Du et al.

(10) Patent No.: US 12,149,270 B2
(45) Date of Patent: Nov. 19, 2024

(54) DATA ACQUISITION METHOD, APPARATUS AND DEVICE, AND STORAGE MEDIUM

(71) Applicant: ZTE CORPORATION, Guangdong (CN)

(72) Inventors: Jinzhou Du, Guangdong (CN); Xiaoliang Gong, Guangdong (CN); Anwen Hu, Guangdong (CN); Long Wen, Guangdong (CN)

(73) Assignee: SANECHIPS TECHNOLOGY CO., LTD., Guangdong (CN)

( * ) Notice: Subject to any disclaimer, the term of this patent is extended or adjusted under 35 U.S.C. 154(b) by 255 days.

(21) Appl. No.: 17/781,087

(22) PCT Filed: Nov. 26, 2020

(86) PCT No.: PCT/CN2020/131637
§ 371 (c)(1),
(2) Date: May 31, 2022

(87) PCT Pub. No.: WO2021/115127
PCT Pub. Date: Jun. 17, 2021

(65) Prior Publication Data
US 2023/0006703 A1    Jan. 5, 2023

(30) Foreign Application Priority Data
Dec. 9, 2019  (CN) .......................... 201911249778.5

(51) Int. Cl.
*H04B 1/04* (2006.01)
*H03F 1/32* (2006.01)

(52) U.S. Cl.
CPC ............. *H04B 1/0475* (2013.01); *H03F 1/32* (2013.01); *H04B 2001/0425* (2013.01)

(58) Field of Classification Search
CPC .. H04B 1/0475; H04B 2001/0425; H03F 1/32
(Continued)

(56) References Cited

U.S. PATENT DOCUMENTS

| | | |
|---|---|---|
| 6,798,843 B1 | 9/2004 | Wright |
| 2011/0258371 A1* | 10/2011 | Yang .................. G11C 11/5628 365/185.11 |
| 2020/0285265 A1* | 9/2020 | Ranganathan ............ G06F 1/12 |

FOREIGN PATENT DOCUMENTS

| | | |
|---|---|---|
| CN | 100483541 C | 4/2009 |
| CN | 1848713 B | 8/2010 |

OTHER PUBLICATIONS

European Patent Office, The extended European search report issued Nov. 30, 2023 for application No. EP20900594.1.

* cited by examiner

*Primary Examiner* — Kevin M Burd
(74) *Attorney, Agent, or Firm* — & Cai Intellectual Property (USA) Office

(57) ABSTRACT

The present application provides a data acquisition method, a data acquisition apparatus, a data acquisition device and a storage medium. The data acquisition method includes: obtaining a first storage flag for indicating a flag bit at which first data starts to be acquired and stored; when a first data acquisition clock is asynchronous with a second data acquisition clock, obtaining a second storage flag being a storage flag bit corresponding to the first storage flag after the first storage flag crosses from the first data acquisition cock to the second data acquisition clock, according to the first data acquisition clock and the second data acquisition clock; and performing anti-jitter processing on the second storage flag to obtain a third storage flag, and acquiring second data according to the third storage flag, a delay between the first data and the second data acquired each time is kept unchanged.

12 Claims, 5 Drawing Sheets

(58) Field of Classification Search
USPC .......................................................... 375/297
See application file for complete search history.

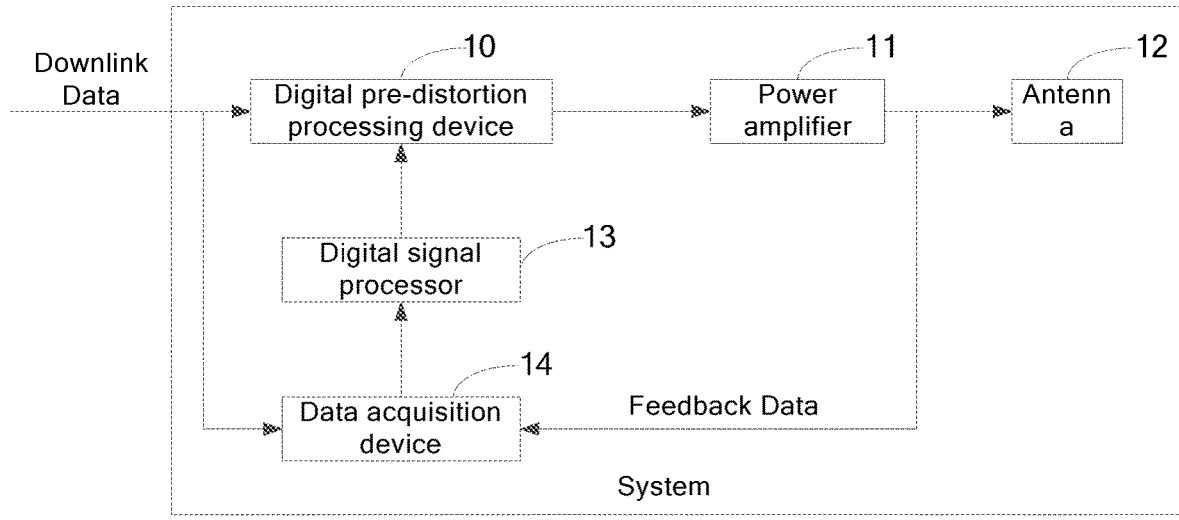

Fig. 1

Obtaining a first storage flag, the first storage flag is configured to indicate a flag bit at which first data starts to be acquired and stored — S101

When a first data acquisition clock is asynchronous with a second data acquisition clock, obtaining a second storage flag according to the first data acquisition clock and the second data acquisition clock, the second storage flag is a storage flag bit corresponding to the first storage flag after the first storage flag crosses from the first data acquisition clock to the second data acquisition clock — S102

Performing anti-jitter processing on the second storage flag to obtain a third storage flag, and acquiring second data according to the third storage flag, a delay between the first data and the second data acquired each time is kept unchanged. — S103

Fig. 2

| Acquiring a first sampling rate corresponding to the first data and a second sampling rate corresponding to the second data | — S201 |

| Configuring a first counting period of a first counter and a count value in the first counting period, and a second counting period of a second counter and a count value in the second counting period according to the first sampling rate and the second sampling rate, lengths of time durations corresponding to the first counting period and the second counting period are equal. | — S202 |

Fig. 3

DATA ACQUISITION METHOD, APPARATUS AND DEVICE, AND STORAGE MEDIUM

CROSS-REFERENCE TO RELATED APPLICATIONS

This is a National Phase Application filed under 35 U.S.C. 371 as a national stage of PCT/CN2020/131637 filed on Nov. 26, 2020, an application claiming the benefit of Chinese application No. 201911249778.5 filed on Dec. 9, 2019, the content of each of which is hereby incorporated by reference in its entirety.

TECHNICAL FIELD

The present application relates to the field of communication, and in particular, to a data acquisition method, a data acquisition apparatus, a data acquisition device and a storage medium.

BACKGROUND

At present, a power amplifier is widely applied in the field of wireless communication systems, and has a nonlinear distortion characteristic for an input signal due to physical characteristics thereof. In order to obtain a linearly amplified output signal, it is desirable to perform nonlinear compensation on the input signal of the power amplifier, and recently, a digital pre-distortion technology is commonly used. The digital pre-distortion technology performs pre-distortion processing on the input signal at an input of the power amplifier, the pre-distortion processing has characteristics opposite to distortion characteristics of the power amplifier, and is used to cancel nonlinear distortion caused by the power amplifier and improve efficiency of the power amplifier. However, the digital pre-distortion technology substantially only support a case where clock domains of downlink data and feedback data are same as each other, and thus has a relatively narrow application range.

SUMMARY

In a first aspect, the present application provides a data acquisition method, including:
 obtaining a first storage flag, the first storage flag is configured to indicate a flag bit at which first data starts to be acquired and stored;
 when a first data acquisition clock is asynchronous with a second data acquisition clock, obtaining a second storage flag according to the first data acquisition clock and the second data acquisition clock, the second storage flag is a storage flag bit corresponding to the first storage flag after the first storage flag crosses from the first data acquisition clock to the second data acquisition clock; and
 performing anti-jitter processing on the second storage flag to obtain a third storage flag, and acquiring second data according to the third storage flag, a delay between the first data and the second data acquired each time is kept unchanged.

In a second aspect, the present application provides a data acquisition apparatus, including:
 a first obtaining module configured to obtain a first storage flag, the first storage flag is configured to indicate a flag bit at which first data starts to be acquired and stored;
 a second obtaining module configured to, when a first data acquisition clock is asynchronous with a second data acquisition clock, obtain a second storage flag according to the first data acquisition clock and the second data acquisition clock, the second storage flag is a storage flag bit corresponding to the first storage flag after the first storage flag crosses from the first data acquisition clock to the second data acquisition clock;
 an anti jitter processing module configured to perform anti-jitter processing on the second storage flag to obtain a third storage flag; and
 a first acquisition module configured to acquire a second data according to the third storage flag, a delay between the first data and the second data acquired each time is kept unchanged.

In a third aspect, the present application provides a data acquisition device, including a memory and a processor, the memory stores a computer program, the processor, when executes the computer program, performs the data acquisition method of the present application described in the first aspect.

In a fourth aspect, the present application provides a storage medium having a computer program stored thereon, the computer program, when executed by a processor, performs the data acquisition method of the present application described in the first aspect.

BRIEF DESCRIPTION OF DRAWINGS

FIG. 1 is a system architecture diagram of an application of a data acquisition method according to the present application;

FIG. 2 is a schematic flowchart of a data acquisition method according to the present application;

FIG. 3 is a schematic flowchart of a data acquisition method according to the present application;

DETAIL DESCRIPTION OF EMBODIMENTS

Figure 4:
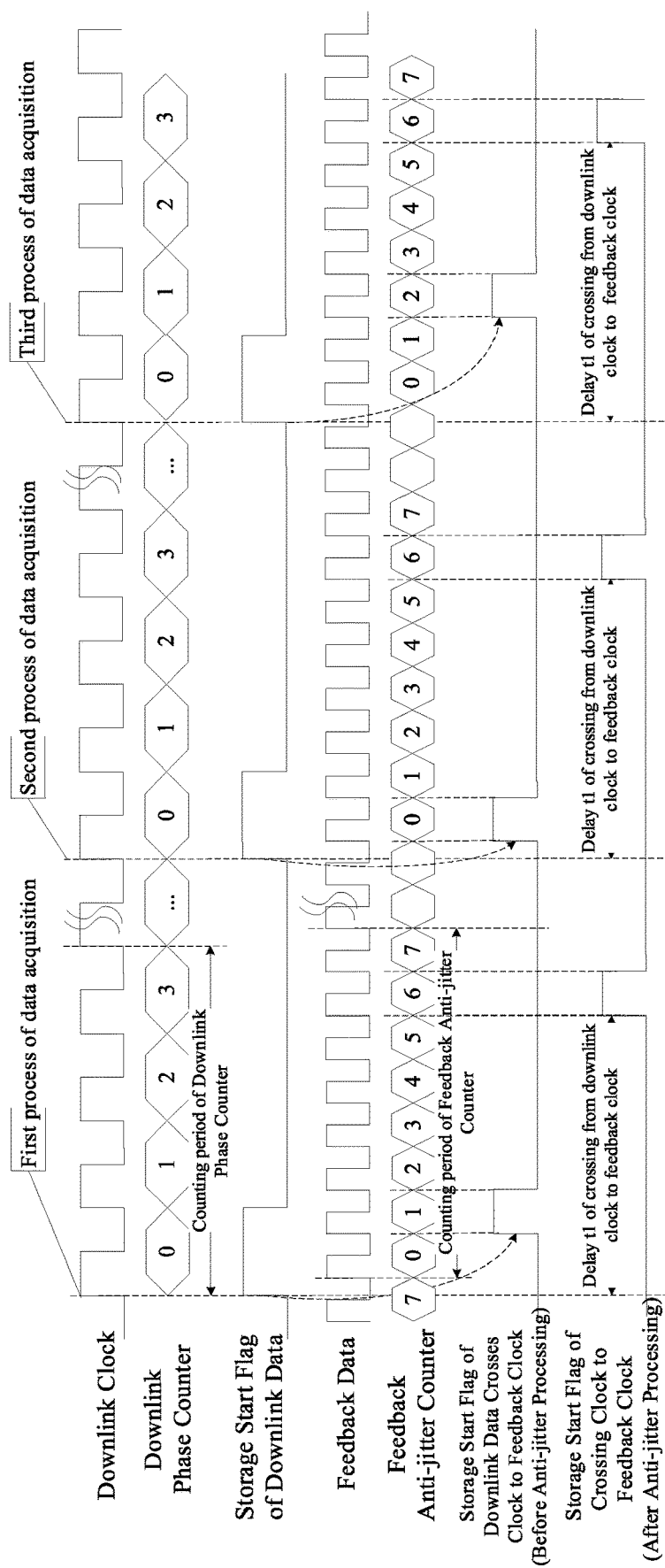
FIG. 4 is a schematic diagram of an anti-jitter processing from downlink to feedback according to the present application.

The present application provides a data acquisition method, which can be applied to a system shown in FIG. 1. The system may include a digital pre-distortion processing device 10, a power amplifier 11, an antenna 12, a digital signal processor 13, a data acquisition device 14 and the like. The digital pre-distortion processing device 10 is configured to perform pre-distortion processing on downlink data and send the downlink data subjected to the pre-distortion processing to the power amplifier 11; the power amplifier 11 performs power amplification on the downlink data subjected to the pre-distortion processing for obtaining output data subjected to the power amplification, and sends the output data to the antenna 12, so as to transmit the output data subjected to the power amplification through the antenna 12; the data acquisition device 14 acquires the downlink data and feedback data (the feedback data are the output data of the power amplifier 11), and sends the acquired downlink data and the acquired feedback data to the digital signal processor 13 for calculation, so as to obtain a digital pre-distortion linklist in the digital pre-distortion processing device 10. In some implementations, the data acquisition device 14 further acquires the downlink data and reflection data (the reflection data are data reflected from the antenna 12), and send the acquired downlink data and the acquired feedback data, and the acquired downlink data and the acquired reflection data to the digital signal processor 13, so as to calculate a standing wave ratio of the power amplifier 11.

In order to make purposes, technical solutions, and advantages of the present application clearer, embodiments of the present application are described below with reference to the accompanying drawings. It should be noted that the embodiments of the present application and characteristics in the embodiments may be combined with each other if no conflict is incurred.

It should be noted that an execution subject for executing the method of the present application described below may be a data acquisition apparatus, and the apparatus may be implemented as part or all of the data acquisition device by software, hardware, or a combination of software and hardware. The embodiments of the present application are described by taking that the execution subject is the data acquisition device as an example.

FIG. 2 is a schematic flowchart of a data acquisition method according to the present application, which relates to a specific process of performing the data acquisition method by the data acquisition device. As shown in FIG. 2, the data acquisition method may include the following operations S101 to S103.

At operation S101, obtaining a first storage flag, the first storage flag is configured to indicate a flag bit at which first data starts to be acquired and stored.

The first storage flag is preconfigured for acquiring first data and configured to indicate the flag bit at which the first data starts to be acquired and stored. A current type of data acquisition being configured to be digital pre-distortion data acquisition is illustrated as an example, the data acquisition device acquires downlink data and feedback data of a target channel, the first data may be the downlink data and second data described below may be the feedback data. In a multi-channel scenario, the data acquisition device may implement switching of channels through a channel switching device, and acquire downlink data and feedback data of the channel which is switched to. For the target channel, when an initial acquisition condition of the downlink data is met, whether the downlink data are acquired is further determined according to whether the first storage flag is reached. In response to the first storage flag is reached, the downlink data starts to be acquired and stored; and in response to the first storage flag is not reached, the downlink data are not acquired, until the first storage flag is reached, and then the downlink data are acquired and stored. The initial acquisition condition is that a symbol-level data acquisition electrical level for controlling acquisition of the downlink data is high, and a priority of a power level corresponding to current downlink data is greater than a priority of a power level corresponding to data previously stored in a buffer register, so that a power level corresponding to the downlink data acquired by the data acquisition device can be ensured to be relatively high.

At operation S102, when a first data acquisition clock (i.e., a clock for acquiring the first data) is asynchronous with a second data acquisition clock (i.e., a clock for acquiring the second data), obtaining a second storage flag according to the first data acquisition clock and the second data acquisition clock, the second storage flag is a storage flag bit corresponding to the first storage flag after the first storage flag crosses from the first data acquisition clock to the second data acquisition clock.

The first data acquisition clock is used for controlling acquisition of the first data, the second data acquisition clock is used for controlling acquisition of second data. Since the first data acquisition clock is asynchronous with the second data acquisition clock, the second storage flag, obtained after the first storage flag crossing clock domain, may vary in each process of data acquisition. If the acquisition of the second data is performed according to the second storage flag obtained after the first storage flag crossing clock domain, at each time, delays of the first data acquired based on the first storage flag and the second data acquired based on the second storage flag may be different. Therefore, anti-jitter processing is desired to be performed on the second storage flag.

At operation S103, performing anti-jitter processing on the second storage flag to obtain a third storage flag, and acquiring second data according to the third storage flag, a delay between the first data and the second data acquired each time is kept unchanged.

The third storage flag is configured to indicate a flag bit at which the second data starts to be acquired and stored. The current type of data acquisition being configured to be digital pre-distortion data acquisition is still illustrated as an example, the second data may be the feedback data, i.e., the data acquisition device determines whether to acquire the feedback data according to whether the third storage flag is reached. In response to the third storage flag is reached, the feedback data starts to be acquired and stored; and in response to the third storage flag is not reached, the feedback data are not acquired, until the third storage flag is reached, and then the feedback data are acquired and stored. It can be understood that the data acquisition device performs an anti jitter processing on the second storage flag to obtain the third storage flag, and the third storage flag keeps a delay between the feedback data acquired each time and the downlink data acquired based on the first storage flag by the data acquisition device unchanged. In some implementations, a process of performing anti jitter processing on the second storage flag may include: configuring the third storage flag at a position far away from the second storage flag, so as to ensure that the delay between the feedback data acquired each time based on the third storage flag and the downlink data keeps unchanged.

The data acquisition device may further acquire data related to a process of detecting a standing wave ratio of the power amplifier, so as to detect the standing wave ratio on the power amplifier. In a data acquisition process for detecting the standing wave ratio, the downlink data and the feedback data may be acquired first, then the downlink data and the reflection data are acquired, and after the downlink data and the feedback data, and the downlink data and the reflection data are acquired, one data acquisition process for detecting the standing wave ratio is completed. Certainly, in one data acquisition process for detecting the standing wave ratio, the downlink data and the reflection data may be acquired first, and then the downlink data and the feedback data are acquired, which is not limited in the present application. When the current type of data acquisition is configured to be data acquisition for detecting the standing wave ratio, an acquisition process of the downlink data and the feedback data may refer to the above described operations S101 to S103, and an acquisition process of the downlink data and the reflection data is described below, in such application scenario, the first data described above are the downlink data, and the second data are the reflection data, and the data acquisition method includes the following operations S101a to S103a.

At operation S101a, obtaining a first storage flag of the downlink data.

The first storage flag is preconfigured for acquiring the downlink data, and is used for indicating a flag bit at which the downlink data starts to be acquired and stored.

At operation S102a, when a downlink data acquisition clock (i.e., a clock for acquiring the downlink data) is asynchronous with a reflection data acquisition clock (i.e., a clock for acquiring the reflection data), obtaining a second storage flag according to the downlink data acquisition clock and the reflection data acquisition clock.

The second storage flag is a storage flag bit corresponding to the first storage flag after the first storage flag crosses from the downlink data acquisition clock to the reflection data acquisition clock.

At operation S103a, performing anti-jitter processing on the second storage flag to obtain a third storage flag, and acquiring the reflection data according to the third storage flag, a delay between the downlink data and the reflection data acquired each time is kept unchanged.

The third storage flag is a storage flag bit at which the reflection data starts to be acquired and stored, i.e., the data acquisition device determines whether to acquire the reflection data according to whether the third storage flag is reached. In response to the third storage flag is reached, the reflection data starts to be acquired and stored; and in response to the third storage flag is not reached, the reflection data are not acquired, until the third storage flag is reached, and then the reflection data are acquired and stored. It can be understood that the data acquisition device performs an anti-jitter processing on the second storage flag to obtain the third storage flag, and the third storage flag keeps a delay between the reflection data acquired each time and the downlink data acquired based on the first storage flag by the data acquisition device unchanged. In some implementations, a process of the anti-jitter processing on the second storage flag may include: configuring the third storage flag at a position far away from the second storage flag, so as to ensure that the delay between the reflection data acquired each time based on the third storage flag and the downlink data keeps unchanged.

With the data acquisition method in the present application, the first storage flag is obtained; when the first data acquisition clock is asynchronous with the second data acquisition clock, the second storage flag is obtained according to the first data acquisition clock and the second data acquisition clock, the second storage flag is the storage flag bit corresponding to the first storage flag after the first storage flag crosses from the first data acquisition clock to the second data acquisition clock; and the anti jitter processing is performed on the second storage flag to obtain the third storage flag, and the second data is acquired according to the third storage flag, a delay between the first data and the second data acquired each time is kept unchanged. Since the data acquisition device performs the anti-jitter processing on the second storage flag after obtaining the second storage flag subjected to clock domain crossing, during each process of data acquisition, the delay between the second data acquired based on the third storage flag obtained through the anti-jitter processing and the first data acquired based on the first storage flag is kept unchanged, i.e., in a process of digital pre-distortion data acquisition, the data acquisition method in the present application can be applied to a case where clock domains of downlink data and feedback data are different, thereby an application range of the data acquisition device is expanded. Moreover, a delay between the downlink data and the feedback data, which are transmitted to the digital signal processor by the data acquisition device, is kept unchanged, so that a calculation complexity of the digital signal processor is simplified, and an accuracy of calculation results of the digital signal processor is also improved.

In practical applications, a counter may be configured to implement that the delay between the first data and the second data acquired each time is kept unchanged, and for such application, the counter is desired to be configured, and a configuration process of the counter is described below. Based on the description above, in some implementations, as shown in FIG. 3, before the operations S101, the data acquisition method further includes operations S201 and S202.

At operations S201, acquiring a first sampling rate corresponding to the first data and a second sampling rate corresponding to the second data.

At operations S202, configuring a first counting period of a first counter and a count value in the first counting period, and a second counting period of a second counter and a count value in the second counting period according to the first sampling rate and the second sampling rate, lengths of time durations corresponding to the first counting period and the second counting period are equal.

The first counter counts cyclically in the first counting period, and the second counter counts cyclically in the second counting period. In response to that the first counting period of the first counter is configured to be n, the count value in the first counting period is counted from 0 to n−1, and is counted circularly; and in response to that the first count period of the first counter is configured to m, the count value in the first count period is counted from 0 to m−1, and is counted cyclically. In some implementations, the data acquisition device may configure the first counting period of the first counter and the second counting period of the second counter according to a ratio between the first sampling rate and the second sampling rate. For example, the ratio between the first sampling rate and the second sampling rate is 1:2, the first counting period of the first counter may be configured to be 1, the count value in the first counting period is 0, i.e., the first counter counts cyclically with 0; and meanwhile, the second count value of the second counter may be configured to be 2, the count value in the second counting period is 0 and 1, i.e., the second counter counts cyclically with 0 and 1. Moreover, although the first counting period of the first counter and the second counting period of the second counter are different, it is desirable to ensure that real lengths of time durations corresponding to the first counting period and the second counting period are equal, so as to ensure that, when the first data are acquired based on a same count value of the first counter and the second data are acquired based on a same count value of the second counter each time, a delay between the count value for acquiring the first data and the count value for acquiring the second value is fixed.

After the first counter and the second counter are configured, and an initial acquisition condition (the initial acquisition condition is that a symbol-level data acquisition electrical level for controlling acquisition of the first data is high, and a priority of a power level corresponding to the first data is greater than a priority of a power level corresponding to data previously stored in a buffer register) of the first data is met, when the first counter counts to a preset count value (the preset count value is a count value at which the first data starts to be acquired and stored), i.e., the first storage flag is reached, the data acquisition device starts to acquire and store the first data. The first storage flag changes into the second storage flag after crossing clock domain, the second storage flag corresponds to a certain count value of the second counter, and since the first data acquisition clock is asynchronous with the second data acquisition clock, at each time, a count value corresponding to the second storage flag obtained after crossing clock domain may vary. If the second data are acquired based on the count value corresponding to the second storage flag obtained after crossing clock domain, a delay between the first data and the second data acquired each time is not fixed, i.e., there is phase jitter between the first data and the second data acquired each time. Therefore, it is desirable to perform the anti-jitter processing on the second storage flag.

In some implementations, the performing anti-jitter processing on the second storage flag to obtain a third storage flag in the operation S103 may include: when the second storage flag obtained after crossing clock domain corresponds to a count value within a preset jitter range of the second counter, adjusting the second storage flag to a position corresponding to any count value outside the jitter range in the second counting period for obtaining the third storage flag.

The jitter range of the second counter relates to count values corresponding to the first data acquisition clock, the second data acquisition clock and the first storage flag, and it should be understood that, when the difference of asynchronization between the first data acquisition clock and the second data acquisition clock is relatively large, the jitter range of the second counter is relatively large, and thus the jitter range of the second counter may be configured to be relatively large. When the difference of asynchronization between the first data acquisition clock and the second data acquisition clock is relatively small, the jitter range of the second counter may be relatively small, and thus the jitter range of the second counter may be configured to be relatively small. Therefore, when the second storage flag obtained after crossing clock domain corresponds to a count value within the jitter range of the second counter, the data acquisition device adjusts the second storage flag to a position corresponding to any count value outside the jitter range in the second counting period for obtaining the third storage flag.

For example, the first data are the downlink data, the second data are the feedback data, and the process of anti-jitter processing on the second storage flag is described by taking a schematic diagram of anti-jitter processing from downlink to feedback shown in FIG. 4 as an example.

In FIG. 4, a downlink clock is a clock for controlling acquisition of the downlink data, a feedback clock is a clock for controlling acquisition of the feedback data, and the data acquisition device, according to a ratio between a sampling rate corresponding to the downlink data and a sampling rate corresponding to the feedback data, may configure a first counting period of a downlink phase counter (the downlink phase counter is the first counter) and a count value in the first counting period and a second counting period of a feedback anti-jitter counter (the feedback anti jitter counter is the second counter) and a count value in the second counting period. For example, the first counting period of the downlink phase counter is configured to be 4, i.e., the downlink phase counter counts cyclically with 4 count values as a period, the 4 count values are 0, 1, 2, and 3 respectively; the second counting period of the feedback anti-jitter counter is configured to be 8, i.e., the feedback anti-jitter counter counts cyclically with 8 count values as a period, the 8 count values are 0, 1, 2, 3, 4, 5, 6, and 7 respectively; and meanwhile, the real lengths of time durations corresponding to the first counting period (i.e., the counting period of the downlink phase counter in FIG. 4) and the second counting period (i.e., the counting period of the feedback anti-jitter counter in FIG. 4) are ensured to be equal.

Then, assuming that the downlink phase counter counts to 0 and reaches the first storage flag (i.e., a storage start flag of the downlink data in FIG. 4), the acquisition and storage of downlink data is started. Meanwhile, it is assumed that a jitter range of the feedback anti-jitter counter is configured to be 0, 1, and 2 based on count values corresponding to the downlink clock, the feedback clock and the first storage flag. In a first process of data acquisition, a count value of the feedback anti jitter counter corresponding to the second storage flag obtained after the first storage flag crossing clock domain is 1. In a second process of data acquisition, the count value of the feedback anti jitter counter corresponding to the second storage flag obtained after the first storage flag crossing clock domain is 0. In a third process of data acquisition, the count value of the feedback anti-jitter counter corresponding to the second storage flag (i.e., obtained after the storage start flag of the downlink data crossing clock domain to the feedback clock before the anti-jitter processing in FIG. 4) obtained after the first storage flag crossing clock domain is 2. That is, since the downlink clock is asynchronous with the feedback clock, in each process of data acquisition, the count value of the feedback anti-jitter counter corresponding to the second storage flag obtained after the first storage flag crossing clock domain may vary (i.e., a count value corresponding to that obtained after the storage start flag of the downlink data crossing clock domain to the feedback clock before the anti jitter processing in FIG. 4 may vary). When the count value corresponding to the second storage flag is located within the jitter range of the feedback anti jitter counter, the data acquisition device may adjust the second storage flag to a position corresponding to any count value outside the jitter range of the feedback anti jitter counter, for example, to a position corresponding to a count value of 6, so as to obtain a third storage flag (i.e., a storage start flag obtained after the storage start flag of the downlink data crossing clock domain to the feedback clock after the anti-jitter processing in FIG. 4, the storage start flag corresponds to the count value of 6). Similarly, the data acquisition device may adjust the second storage flag to a position corresponding to a count value of 3, 4, or 5. During each process of data acquisition, the data acquisition device acquires the downlink data based on the count value "0" corresponding to the first storage flag, and acquires the feedback data based on the count value "6" corresponding to the third storage flag, a delay between the acquired downlink data and the feedback data is kept unchanged (i.e., a delay of crossing clock domain from the downlink clock to the feedback clock in FIG. 4 is t1).

For a case where the current type of data acquisition is configured to be data acquisition for detecting a standing wave ratio, in a process of acquiring the downlink data and the reflection data, the process of anti-jitter processing on the second storage flag used for acquiring the reflection data may refer to the process of anti-jitter processing on the second storage flag used for acquiring the feedback data described above, and thus is not repeated here.

In some implementations, the performing anti-jitter processing on the second storage flag to obtain a third storage flag in the operation S103 may include: when the second storage flag obtained after crossing clock domain corresponds to a first count value outside the preset jitter range of the second counter, modifying the first count value corresponding to the second storage flag to a second count value, the second count value is any count value within the jitter range; and recounting the second counter by taking the second count value as a starting point for counting, adjusting the second storage flag to a position corresponding to a third count value to obtain the third storage flag, the third count value is any count value outside the jitter range in the second counting period subjected to the recounting.

Specifically, the jitter range of the second counter described above relates to count values corresponding to the first data acquisition clock, the second data acquisition clock and the first storage flag, and it should be understood that, when the difference of asynchronization between the first data acquisition clock and the second data acquisition clock is relatively large, the jitter range of the second counter is relatively large, and thus the jitter range of the second counter may be configured to be relatively large. When the difference of asynchronization between the first data acquisition clock and the second data acquisition clock is relatively small, the jitter range of the second counter may be relatively small, and thus the jitter range of the second counter may be configured to be relatively small. When the second storage flag corresponds to the first count value outside the jitter range of the second counter, it is considered that a phase deviation between the first data acquisition clock and the second data acquisition clock increases with an accumulation for a long time, and the count value of the second counter is desired to be reset, so that the count value corresponding to the second storage flag after crossing the clock domain is located within the jitter range of the second counter again.

Figure 5:
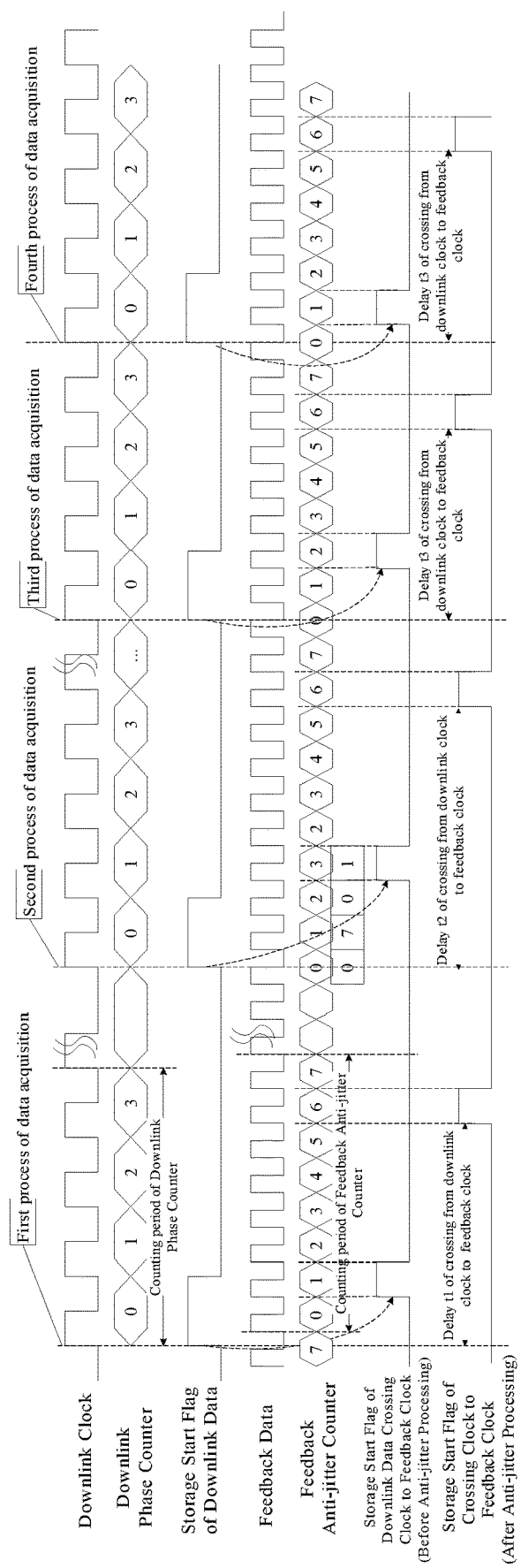
FIG. 5 is a schematic diagram of an anti-jitter processing from downlink to feedback according to the present application.

For example, the first data are the downlink data, the second data are the feedback data, and the process of anti-jitter processing on the second storage flag is described by taking a schematic diagram of anti-jitter processing from downlink to feedback shown in FIG. 5 as an example In FIG. 5, a downlink clock is a clock for controlling acquisition of the downlink data, a feedback clock is a clock for controlling acquisition of the feedback data, and the data acquisition device, according to a ratio between a sampling rate corresponding to the downlink data and a sampling rate corresponding to the feedback data, may configure a first counting period of a downlink phase counter (the downlink phase counter is the first counter) and a count value in the first counting period and a second counting period of a feedback anti-jitter counter (the feedback anti jitter counter is the second counter) and a count value in the second counting period. For example, the first counting period of the downlink phase counter is configured to be 4, i.e., the downlink phase counter counts cyclically with 4 count values as a period, the 4 count values are 0, 1, 2, and 3 respectively; the second counting period of the feedback anti-jitter counter is configured to be 8, i.e., the feedback anti-jitter counter counts cyclically with 8 count values as a period, the 8 count values are 0, 1, 2, 3, 4, 5, 6, and 7 respectively; and meanwhile, the real lengths of time durations corresponding to the first counting period (i.e., the counting period of the downlink phase counter in FIG. 5) and the second counting period (i.e., the counting period of the feedback anti-jitter counter in FIG. 5) are ensured to be equal.

Then, assuming that the downlink phase counter counts to 0 and reaches the first storage flag (i.e., a storage start flag of the downlink data in FIG. 5), the acquisition and storage of downlink data are started. Meanwhile, it is assumed that a jitter range of the feedback anti-jitter counter is configured to be 0, 1, and 2 based on count values corresponding to the downlink clock, the feedback clock and the first storage flag. In a first process of data acquisition, a count value of the feedback anti jitter counter corresponding to the second storage flag (i.e., obtained after the storage start flag of the downlink data crossing clock domain to the feedback clock before the anti-jitter processing in FIG. 5) obtained after the first storage flag crossing clock domain is 1. In a second process of data acquisition, a count value of the feedback anti jitter counter corresponding to the second storage flag obtained after the first storage flag crossing clock domain is 3, i.e., in the second process of data acquisition, the count value of the feedback anti jitter counter corresponding to the second storage flag obtained after the first storage flag crossing clock domain is located outside the jitter range of the feedback anti jitter counter. In such case, the count value of the feedback anti-jitter counter is desired to be reset, the count value "3" of the feedback anti-jitter counter corresponding to the second storage flag may be adjusted to be any count value within the jitter range of the feedback anti-jitter counter. In some implementations, the count value of the feedback anti-jitter counter may be reset to any count value at a middle position within the jitter range of the feedback anti-shake counter, for example, the count value "3" of the feedback anti-jitter counter corresponding to the second storage flag may be adjusted to be a count value "1", and the feedback anti jitter counter is recounted with the count value "1" as a start point. As shown in FIG. 5, in the second process of data acquisition, the counting is recounted with the count value "1" as a start point, and thus a count value after the count value "3" of the feedback anti-jitter counter is 2. After resetting the count value of the feedback anti-jitter counter, any count value in a feedback anti jitter counting period after recounting may be selected as a count value for starting to acquire the feedback data, and a position corresponding to such count value is used as a third storage flag (i.e., obtained after the storage start flag of the downlink data crossing clock domain to the feedback clock after the anti-jitter processing in FIG. 5). For example, a position corresponding to the count value "6" may be selected as the third storage flag, and a third process of data acquisition, a fourth process of data acquisition and the like may be performed with such position as a start point. In addition, any of positions corresponding to the count values "3", "4", and "5" after recounting may also be selected as the third storage flag, which is not limited in the present application. Therefore, when data are subsequently acquired, the data acquisition device acquires the downlink data based on the count value "0" corresponding to the first storage flag, and acquires the feedback data based on the count value "6" corresponding to the third storage flag, a delay between the acquired downlink data and the feedback data is kept unchanged (for example, in FIG. 5, in the third process of data acquisition and the fourth process of data acquisition, the delay of crossing clock domain from the downlink clock to the feedback clock is t3; in the first process of data acquisition, the delay of crossing clock domain from the downlink clock to the feedback clock is t1; in the second process of data acquisition, the delay of crossing clock domain from the downlink clock to the feedback clock is t2, and since the count value of the feedback anti-jitter counter is reset, t1 is not equal to t2).

Certainly, for a case where the current type of data acquisition is configured to be data acquisition for detecting a standing wave ratio, in a process for acquiring the downlink data and the reflection data, the process of anti jitter processing on the second storage flag used for acquiring the reflection data may refer to the process of anti-jitter processing on the second storage flag used for acquiring the feedback data described above, and thus is not repeated here.

In the data acquisition device of the present application, by providing the first counter and the second counter and configuring the first counter and the second counter according to a sampling rate corresponding to the first data and a sampling rate corresponding to the second data, the anti-jitter processing is performed on the second storage flag based on the first counter and the second counter, which simplifies circuits of the data acquisition device, and saves hardware logic resources. In addition, the data acquisition device may perform anti jitter processing on the second storage flag by adopting a corresponding anti jitter processing mode according to different jitter conditions of the second storage flag obtained after crossing clock domain, so that a flexibility of the anti jitter processing is improved, and an application range of the data acquisition device is further expanded.

To match the acquired first data and the acquired second data, based on the above, in some implementations, after the above operation S101, the data acquisition method further includes: performing delay processing on the first storage flag, a length of delay time is related to a link delay from a digital pre-distortion circuit to a power amplifier.

After obtaining the first storage flag subjected to the delay processing, the data acquisition device, according to the first data acquisition clock and the second data acquisition clock, obtains a storage flag obtained after the first storage flag subjected to the delay processing crossing clock domain, and then performs anti jitter processing on the storage flag obtained after crossing the clock domain, and acquires the second data based on the storage flag subjected to the anti-jitter processing.

In some implementations, when the first data acquisition clock is synchronous with the second data acquisition clock, the data acquisition device may acquire the second data according to the first storage flag subjected to the delay processing.

In the present application, the data acquisition device may further perform delay processing on the first storage flag, so that the acquired second data are matched with the acquired first data, thereby accuracy of data acquisition is improved. In addition, for a case where the first data acquisition clock is synchronous with the second data acquisition clock, the data acquisition device can also acquire data, so that an application range of the data acquisition device is further expanded.

In addition, the data acquisition method in the present application enables the data acquisition device to perform not only digital pre-distortion data acquisition, but also data acquisition for detecting the standing-wave ratio, under a condition with little increase of resources, a good unity of the digital pre-distortion data acquisition and the data acquisition for detecting the vector standing wave ratio is achieved, and functions of the data acquisition device are enhanced, i.e., the application range of the data acquisition device is further expanded.

For understanding of those skilled in the art, the current type of data acquisition being configured to be digital pre-distortion data acquisition is illustrated below as an example, and the first data are the downlink data and the second data are the feedback data.

Firstly, relevant parameters are configured according to an application scenario of the data acquisition, and a specific configuration process includes:

1) configuring the current type of data acquisition to be the digital pre-distortion data acquisition, i.e., acquiring the downlink data and the feedback data;
2) configuring a channel number of current data acquisition and a priority of data of each power level according to a channel and numbering of the power level to be acquired, and after the channel number is configured, the data acquisition device may select the channel to be acquired through a channel switching device according to the configured channel number; and
3) configuring the downlink phase counter and the feedback anti-jitter counter according to a ratio of the downlink sampling rate to the feedback sampling rate, and after configuration of the counters is completed, the data acquisition device counts cyclically with configured values of the downlink phase counter and the feedback anti jitter counter as counting periods, and real lengths of time durations represented by the counting periods of the configured downlink phase counter and the configured feedback anti jitter counter are desired to be equal, so as to ensure a delay between the downlink data and the feedback data acquired each time is kept unchanged.

Then, a data acquisition request is initiated, and a ready state of data acquisition is entered. After entering the ready state of data acquisition, when a symbol-level data acquisition electrical level is high and a priority of a power level corresponding to the current downlink data is greater than the priority of the power level corresponding to data previously stored in a buffer register, a state of data acquisition is entered;

otherwise, waiting is continued, until the symbol-level data acquisition electrical level is high and the priority of the power level corresponding to the current downlink data is greater than the priority of the power level corresponding to data previously stored in a buffer register.

After entering the state of data acquisition and the downlink phase counter counts to a preset count value (e.g., the count value "0"), the acquisition and storage of the downlink data are started, otherwise, waiting is continued until the downlink phase counter counts to the preset count value.

After the storage of the downlink data is started, delay processing is first performed on the first storage flag of the downlink data (a length of delay time may be configured, and in some implementations, the length of delay time may be configured to be a link delay from a digital pre-distortion circuit to a power amplifier). Then, when clocks of the downlink data and the feedback data are completely the same (i.e., frequencies of the two clocks are the same and phases of the two clocks are the same), the acquisition and storage of the feedback data are immediately started with the first storage flag subjected to the delay processing as an acquisition and storage start flag of the feedback data; when the clock of the downlink data is asynchronous with the clock of the feedback data, a storage flag after the first storage flag subjected to the delay processing crossing clock domain is obtained, and the anti-jitter processing is performed on the storage flag after crossing clock domain, the storage flag subjected to the anti jitter processing is used to be the acquisition and storage start flag of the feedback data. A specific process of the anti-jitter processing may refer to the description above, and thus is not repeated here.

Then, after the downlink data and the feedback data are acquired and stored, an effectiveness of data acquired this time may be judged according to a certain judgment criteria (such as peak effectiveness, level consistency, continuous small signals and the like), so as to determine whether data currently stored in a buffer register is to be reserved. In response to that the judgment for the effectiveness of the data acquired this time is passed, i.e., the data acquired this time is judged to be effective, the data currently stored in the buffer register may be reserved, and meanwhile, a priority of the power level of the buffer register is updated to be a priority of the power level of the data acquired currently. It can be understood that when data with a priority higher than that of the power level of the buffer register arrives in the future, data acquisition may be performed again to overwrite the data previously stored in the buffer register, otherwise, the data in the buffer register would not be overwritten, unless a data acquisition request is reinitiated next time; in response to that the judgment for the effectiveness of the data acquired this time is not passed, i.e., the data acquired this time is judged to be ineffective, the data currently stored in the buffer register may be discarded, and meanwhile, a priority of the power level of the buffer register is reduced to minimum, and subsequently, if data with a priority higher than that of the power level of the buffer register arrives, data acquisition may be started. It can be understood that buffer registers may be configured for the downlink data and the feedback data, respectively.

After receiving a request of stopping the data acquisition, the data acquisition is stopped. The data acquisition device may further switch to other channels through the channel switching device, so as to acquire downlink data and feedback data in other channels.

Next, a current type of data acquisition being configured to be the data acquisition for detecting a standing wave ratio is described below as an example. The downlink data and the feedback data may be acquired firstly, then the downlink data and the reflection data are acquired, and after the downlink data and the feedback data, and the downlink data and the reflection data are acquired, one complete data acquisition for detecting the standing wave ratio is completed. When the downlink data and the feedback data are acquired, the first data are the downlink data and the second data are the feedback data; and when the downlink data and the reflection data are acquired, the first data are the downlink data and the second data are reflection data. The process of acquiring the downlink data and the feedback data may refer to the process of the digital pre-distortion data acquisition described above, a process of acquiring the downlink data and the reflection data is described below.

Firstly, relevant parameters are configured according to an application scenario of the data acquisition, and a specific configuration process includes:

1) configuring the current type of data acquisition to be the data acquisition for detecting the standing wave ratio, i.e., acquiring the downlink data and the reflection data;
2) configuring a channel number of current data acquisition and a priority of data of each power level according to a channel and numbering of the power level to be acquired, and after the channel number is configured, the data acquisition device may select the channel to be acquired through a channel switching device according to the configured channel number; and
3) configuring the downlink phase counter and the reflection anti-jitter counter according to a ratio of the downlink sampling rate to the reflection sampling rate, and after configuration of the counters is completed, the data acquisition device counts cyclically with configuration values of the downlink phase counter and the reflection anti-jitter counter as counting periods, and real lengths of time durations represented by the counting periods of the configured downlink phase counter and the configured reflection anti jitter counter are desired to be equal, so as to ensure a delay between the downlink data and the reflection data acquired each time is kept unchanged.

Then, a data acquisition request is initiated, and a ready state of data acquisition is entered. After entering the ready state of data acquisition, when a symbol-level data acquisition electrical level is high and a priority of a power level corresponding to the current downlink data is greater than the priority of the power level corresponding to data previously stored in a buffer register, a state of data acquisition is entered; otherwise, waiting is continued until the symbol-level data acquisition electrical level is high and the priority of the power level corresponding to the current downlink data is greater than the priority of the power level corresponding to the data previously stored in the buffer register.

After entering the state of data acquisition and the downlink phase counter counts to a preset count value (e.g., the count value "0"), the acquisition and storage of the downlink data are started, otherwise, waiting is continued until the downlink phase counter counts to the preset count value.

After the storage of the downlink data is started, delay processing is first performed on the first storage flag of the downlink data (a length of delay time may be configured, and in some implementations, a length of delay time may be configured to be a link delay from a digital pre-distortion circuit to a power amplifier). Then, when clocks of the downlink data and the reflection data are completely the same (i.e., frequencies of the two clocks are the same, and phases of the two clocks are the same), the acquisition and storage of the reflection data are immediately started with the first storage flag subjected to the delay processing as an acquisition and storage start flag of the reflection data; when the clock of the downlink data is asynchronous with the clock of the reflection data, a storage flag after the first storage flag subjected to the delay processing crossing clock domain is obtained, and the anti-jitter processing is performed on the storage flag after crossing clock domain, the storage flag subjected to the anti jitter processing is used as the acquisition and storage start flag of the reflection data. A specific process of the anti jitter processing may refer to the description above, and thus is not repeated here.

Then, after the downlink data and the reflection data are acquired and stored, an effectiveness of data acquired this time may be judged according to a certain judgment criteria (such as peak effectiveness, level consistency, continuous small signals and the like), so as to determine whether data currently stored in a buffer register is to be reserved. In response to that the judgment for the effectiveness of the data acquired this time is passed, i.e., the data acquired this time is judged to be effective, the data currently stored in the buffer register may be reserved, and meanwhile, a priority of the power level of the buffer register is updated to be a priority of the power level of the data acquired currently. It can be understood that when data with a priority higher than that of the power level of the buffer register arrives in the future, data acquisition may be performed again to overwrite the data previously stored in the buffer register, otherwise, the data in the buffer register would not be overwritten, unless a data acquisition request is reinitiated next time; in response to that the judgment for the effectiveness of the data acquired this time is not passed, i.e., the data acquired this time is judged to be ineffective, the data currently stored in the buffer register may be discarded, and meanwhile, the priority of the power level of the buffer register is reduced to minimum, and subsequently, if data with a priority higher than that of the power level of the buffer register arrives, data acquisition may be started. It can be understood that buffer registers may be configured for the downlink data and the reflection data, respectively.

After receiving a request of stopping the data acquisition, the data acquisition is stopped. The data acquisition device may further switch to other channels through the channel switching device, so as to acquire downlink data and reflection data in other channels.

In the present application, the data acquisition device can perform not only digital pre-distortion data acquisition, but also data acquisition for detecting the standing-wave ratio, under the condition with little increase of resources, a good unity of the digital pre-distortion data acquisition and the data acquisition for detecting the vector standing wave ratio is achieved, and functions of the data acquisition device are enhanced, i.e., the application range of the data acquisition device is further expanded. In addition, for asynchronous clocks, the anti jitter processing may be performed on a start storage flag obtained after crossing clock domain, so that the delay between the acquired downlink data and the acquired feedback data is kept unchanged, and the delay between the acquired downlink data and the acquired reflection data is kept unchanged, so that an application range of the data acquisition device is expanded, a calculation complexity of the digital signal processor is simplified, and an accuracy of calculation results of the digital signal processor is also improved.

Figure 6:
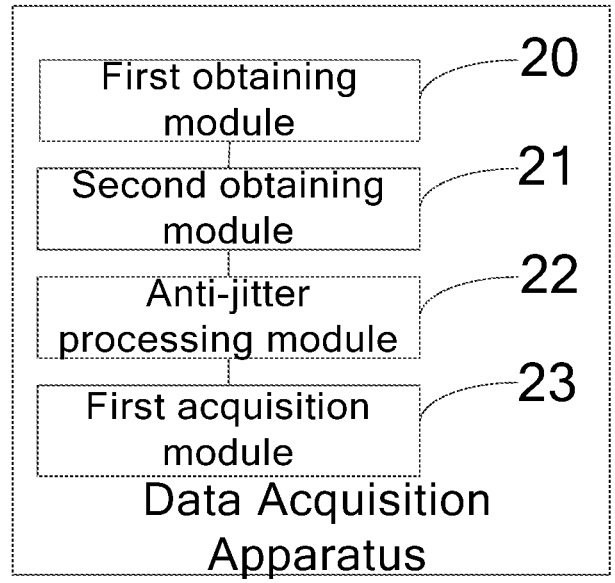
FIG. 6 is a structural schematic diagram of a data acquisition apparatus according to the present application.

FIG. 6 is a structural schematic diagram of a data acquisition apparatus according to the present application. As shown in FIG. 6, the apparatus may include a first obtaining module 20, a second obtaining module 21, an anti jitter processing module 22 and a first acquisition module 23.

The first obtaining module 20 is configured to obtain a first storage flag, the first storage flag is configured to indicate a flag bit at which first data starts to be acquired and stored.

The second obtaining module 21 is configured to, when a first data acquisition clock is asynchronous with a second data acquisition clock, obtain a second storage flag according to the first data acquisition clock and the second data acquisition clock, the second storage flag is a storage flag bit corresponding to the first storage flag after the first storage flag crosses from the first data acquisition clock to the second data acquisition clock.

The anti-jitter processing module 22 is configured to perform anti-jitter processing on the second storage flag to obtain a third storage flag.

The first acquisition module 23 is configured to acquire a second data according to the third storage flag, a delay between the first data and the second data acquired each time is kept unchanged.

With the data acquisition apparatus in the present application, the first storage flag is obtained; when the first data acquisition clock is asynchronous with the second data acquisition clock, the second storage flag is obtained according to the first data acquisition clock and the second data acquisition clock, the second storage flag is the storage flag bit corresponding to the first storage flag after the first storage flag crosses from the first data acquisition clock to the second data acquisition clock; and the anti jitter processing is performed on the second storage flag to obtain the third storage flag, and the second data is acquired according to the third storage flag, a delay between the first data and the second data acquired each time is kept unchanged. Since the data acquisition device performs the anti jitter processing on the second storage flag after obtaining the second storage flag subjected to clock domain crossing, during each process of data acquisition, the delay between the second data acquired based on the third storage flag obtained after the anti-jitter processing and the first data acquired based on the first storage flag is kept unchanged, i.e., in a process of the digital pre-distortion data acquisition, the data acquisition apparatus in the present application can be applied to a case where clock domains of downlink data and feedback data are different, thereby an application range of the data acquisition apparatus is expanded. Moreover, a delay between the downlink data and the feedback data, which are transmitted to the digital signal processor by the data acquisition device, is kept unchanged, so that a calculation complexity of the digital signal processor is simplified, and an accuracy of calculation results of the digital signal processor is also improved.

On the basis of the above description, in some implementations, the data acquisition apparatus further includes a third obtaining module and a configuration module.

Specifically, the third obtaining module is configured to, before the first obtaining module 20 obtains the second storage flag, acquire a first sampling rate corresponding to the first data and a second sampling rate corresponding to the second data; and the configuration module is configure a first counting period of a first counter and a count value in the first counting period, and a second counting period of a second counter and a count value in the second counting period according to the first sampling rate and the second sampling rate, lengths of time durations corresponding to the first counting period and the second counting period are equal.

On the basis of the above description, in some implementations, the anti-jitter processing module 22 is configured to, when the second storage flag corresponds to a count value within a preset jitter range of the second counter, adjust the second storage flag to a position corresponding to any count value outside the jitter range in the second counting period for obtaining the third storage flag.

On the basis of the above description, in some implementations, the anti-jitter processing module 22 is configured to, when the second storage flag corresponds to a first count value outside the preset jitter range of the second counter, modify the first count value corresponding to the second storage flag to a second count value, the second count value is any count value within the jitter range; and the second counter is recounted by taking the second count value as a starting point for counting, the second storage flag is adjusted to a position corresponding to a third count value to obtain the third storage flag, the third count value is any count value outside the jitter range in the second counting period after recounting.

On the basis of the above description, in some implementations, the data acquisition apparatus further includes a delay processing module.

Specifically, the delay processing module is configured to, after the first obtaining module 20 obtains the first storage flag, perform delay processing on the first storage flag, a length of delay time is related to a link delay from a digital pre-distortion circuit to a power amplifier.

On the basis of the above description, in some implementations, the data acquisition apparatus further includes a second acquisition module configured to, when the first data acquisition clock is synchronous with the second data acquisition clock, acquire the second data according to the first storage flag subjected to the delay processing.

In some implementations, in response to that a current type of data acquisition is configured to be digital pre-distortion data acquisition, the first data are downlink data and the second data are feedback data.

In some implementations, in response to that the current type of the data acquisition is configured to be data acquisition for detecting a standing wave ratio, when acquisition of the downlink data and the feedback data are performed, the first data are the downlink data and the second data are the feedback data; and when acquisition of the downlink data and the reflection data are performed, the first data are the downlink data and the second data are the reflection data.

Figure 7:
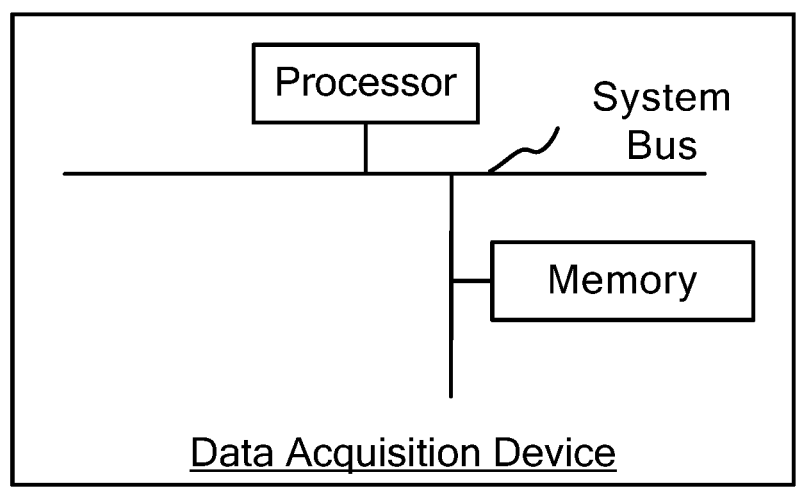
FIG. 7 is a structural schematic diagram of a data acquisition device according to the present application.

The present application further provides a data acquisition device, and the structure of the data acquisition device may be as shown by the structural schematic diagram of the data acquisition device in FIG. 7. The data acquisition device includes a processor and a memory which are connected by a system bus. The processor provides capabilities for computing and control, the memory stores a computer program, the computer program, when executed by the processor, performs the data acquisition method in the present application.

It should be understood for those skilled in the art that the structure shown in FIG. 7 is a block diagram of a part of the structure related to the solution of the present application, rather than forming a limitation for the device applied in the present application, the device applied in the present application may include more or less components than those shown in the FIG. 7, or include a combination of certain components, or include different component arrangements.

The present application further provides a data acquisition device, which includes a memory and a processor, the memory include a computer program, the processor, when executes the computer program, performs operations including: obtaining a first storage flag, the first storage flag is configured to indicate a flag bit at which first data starts to be acquired and stored; when a first data acquisition clock is asynchronous with a second data acquisition clock, obtaining a second storage flag according to the first data acquisition clock and the second data acquisition clock, the second storage flag is a storage flag bit corresponding to the first storage flag after the first storage flag crosses from the first data acquisition clock to the second data acquisition clock; and performing anti jitter processing on the second storage flag to obtain a third storage flag, and acquiring second data according to the third storage flag, a delay between the first data and the second data acquired each time is kept unchanged.

In some implementations, the processor, when executes the computer program, further performs operations including: acquiring a first sampling rate corresponding to the first data and a second sampling rate corresponding to the second data; and configuring a first counting period of a first counter and a count value in the first counting period, and a second counting period of a second counter and a count value in the second counting period according to the first sampling rate and the second sampling rate, lengths of time durations corresponding to the first counting period and the second counting period are equal.

In some implementations, the processor, when executes the computer program, further performs operations including: when the second storage flag corresponds to a count value within a preset jitter range of the second counter, adjusting the second storage flag to a position corresponding to any count value outside the jitter range in the second counting period for obtaining the third storage flag.

In some implementations, the processor, when executes the computer program, further performs operations including: when the second storage flag corresponds to a first count value outside the preset jitter range of the second counter, modifying the first count value corresponding to the second storage flag to a second count value, the second count value is any count value within the jitter range; and recounting the second counter by taking the second count value as a starting point for counting, adjusting the second storage flag to a position corresponding to a third count value to obtain the third storage flag, the third count value is any count value outside the jitter range in the second counting period after the recounting.

In some implementations, the processor, when executes the computer program, further performs operations including: performing delay processing on the first storage flag, a length of delay time is related to a link delay from a digital pre-distortion circuit to a power amplifier.

In some implementations, the processor, when executes the computer program, further performs operations including: when the first data acquisition clock is synchronous with the second data acquisition clock, acquiring the second data according to the first storage flag subjected to the delay processing.

In some implementations, in response to that a current type of data acquisition is configured to be digital pre-distortion data acquisition, the first data are downlink data and the second data are feedback data.

In some implementations, in response to that the current type of the data acquisition is configured to be data acquisition for detecting a standing wave ratio, when acquisition of the downlink data and the feedback data are performed, the first data are the downlink data and the second data are the feedback data; and when acquisition of the downlink data and reflection data are performed, the first data are the downlink data and the second data are the reflection data.

The present application further provides a storage medium having a computer program stored thereon, the computer program, when executed by a processor, performs operations including: obtaining a first storage flag, the first storage flag is configured to indicate a flag bit at which first data starts to be acquired and stored; when a first data acquisition clock is asynchronous with a second data acquisition clock, obtaining a second storage flag according to the first data acquisition clock and the second data acquisition clock, the second storage flag is a storage flag bit corresponding to the first storage flag after the first storage flag crosses from the first data acquisition clock to the second data acquisition clock; and performing anti-jitter processing on the second storage flag to obtain a third storage flag, and acquiring second data according to the third storage flag, a delay between the first data and the second data acquired each time is kept unchanged.

In some implementations, the computer program, when executed by a processor, further performs operations including: acquiring a first sampling rate corresponding to the first data and a second sampling rate corresponding to the second data; and configuring a first counting period of a first counter and a count value in the first counting period, and a second counting period of a second counter and a count value in the second counting period according to the first sampling rate and the second sampling rate, lengths of time durations corresponding to the first counting period and the second counting period are equal.

In some implementations, the computer program, when executed by a processor, further performs operations including: when the second storage flag corresponds to a count value within a preset jitter range of the second counter, adjusting the second storage flag to a position corresponding to any count value outside the jitter range in the second counting period for obtaining the third storage flag.

In some implementations, the computer program, when executed by a processor, further performs operations including: when the second storage flag corresponds to a first count value outside the preset jitter range of the second counter, modifying the first count value corresponding to the second storage flag to a second count value, the second count value is any count value within the jitter range; and recounting the second counter by taking the second count value as a starting point for counting, adjusting the second storage flag to a position corresponding to a third count value to obtain the third storage flag, the third count value is any count value outside the jitter range in the second counting period after the recounting.

In some implementations, the computer program, when executed by a processor, further performs operations including: performing delay processing on the first storage flag, a length of delay time is related to a link delay from a digital pre-distortion circuit to a power amplifier.

In some implementations, the computer program, when executed by a processor, further performs operations including: when the first data acquisition clock is synchronous with the second data acquisition clock, acquiring the second data according to the first storage flag subjected to the delay processing.

In some implementations, in response to that a current type of data acquisition is configured to be digital pre-distortion data acquisition, the first data are downlink data and the second data are feedback data.

In some implementations, in response to that the current type of the data acquisition is configured to be data acquisition for detecting a standing wave ratio, when acquisition of the downlink data and the feedback data are performed, the first data are the downlink data and the second data are the feedback data; and when acquisition of the downlink data and reflection data are performed, the first data are the downlink data and the second data are the reflection data.

The data acquisition apparatus, the data acquisition device and the storage medium described above can perform the data acquisition method in the present application, and have functional modules for performing the method and beneficial effects corresponding to the method. The technical details not described in detail here may be referred to the description of the data acquisition method in the present application.

The above description is merely a schematic explanation of the present application, rather than limiting the protection scope of the present application.

The present application may be implemented in hardware (such as special purpose circuits), software, or any combination thereof. For example, some aspects may be implemented in hardware, while other aspects may be implemented in firmware or software which may be executed by a controller, a microprocessor or other computing devices, although the present application is not limited thereto.

The present application may be implemented by a data processor of a fault injection test device executing computer program instructions, for example, in a processor entity, or by hardware, or by a combination of software and hardware. The computer program instructions may be assembler instructions, instruction set architecture (ISA) instructions, machine instructions, machine-related instructions, microcode, firmware instructions, state setting data, or source or object codes written in any combination of one or more programming languages.

The block diagram of any logical flowchart in the accompanying drawings of the present application may represent program operations; or represent interconnected logic circuits, modules, and functions; or represent a combination of program operations and logic circuits, modules and functions. The computer program may be stored in a storage device. The storage device may be of any type suitable for the local technical environment and may be implemented by using any suitable data storage technology, includes, but is not limited to, a Random Access Memory (RAM), a Read-Only Memory (ROM), an optical storage device and system (a digital video disc (DVD) or a compact disc(CD)) and the like. The computer-readable medium may include a non-transitory storage medium. The data processor may be of any type suitable for the local technical environment, includes, but is not limited to, a general computer, a specific computer, a microprocessor, a digital signal processor (DSP), an application specific integrated circuit (ASIC), a field programmable gate array (FPGA), and a processor based on a multi-core processor architecture.

With the data acquisition method, the data acquisition apparatus, the data acquisition device and the storage medium in the present application, the first storage flag is obtained; when the first data acquisition clock is asynchronous with the second data acquisition clock, the second storage flag is obtained according to the first data acquisition clock and the second data acquisition clock, the second storage flag is the storage flag bit corresponding to the first storage flag after the first storage flag crosses from the first data acquisition clock to the second data acquisition clock; and the anti jitter processing is performed on the second storage flag to obtain the third storage flag, and the second data is acquired according to the third storage flag, a delay between the first data and the second data acquired each time is kept unchanged. Since the anti jitter processing is performed on the second storage flag after obtaining the second storage flag after crossing clock domain, during each process of data acquisition, the delay between the second data acquired based on the third storage flag obtained after the anti jitter processing and the first data acquired based on the first storage flag is kept unchanged, i.e., in a process of the digital pre-distortion data acquisition, the data acquisition method in the present application can be applied to a case where clock domains of downlink data and feedback data are different, thereby an application range of the data acquisition device is expanded. Moreover, a delay between the downlink data and the feedback data, which are transmitted to the digital signal processor by the data acquisition device, is kept unchanged, so that a calculation complexity of the digital signal processor is simplified, and an accuracy of calculation results of the digital signal processor is also improved.

The above description provides a detailed description of exemplary embodiments of the present application, which are examples but not limited. In conjunction with the accompanying drawings and claims, various modifications and adjustments for the above examples are apparent for those skilled in the art, but do not depart from scope of the present application. The scope of the present application is determined by the claims.

What is claimed is:

1. A data acquisition method, comprising:
obtaining a first storage flag, the first storage flag is configured to indicate a flag bit at which first data starts to be acquired and stored;
in response to a first data acquisition clock and a second data acquisition clock asynchronous with each other, obtaining a second storage flag according to the first data acquisition clock and the second data acquisition clock, the second storage flag is a storage flag bit corresponding to the first storage flag after the first storage flag crosses from the first data acquisition clock to the second data acquisition clock; and
performing anti-jitter processing on the second storage flag to obtain a third storage flag, and acquiring second data according to the third storage flag, wherein, a delay between the first data and the second data acquired each time is kept unchanged,
a length of the delay is related to a link delay from a digital pre-distortion circuit to a power amplifier.

2. The method of claim 1, further comprising:
before obtaining the first storage flag, acquiring a first sampling rate corresponding to the first data and a second sampling rate corresponding to the second data; and
configuring a first counting period of a first counter and a count value in the first counting period, and a second counting period of a second counter and a count value in the second counting period according to the first sampling rate and the second sampling rate, wherein lengths of time durations corresponding to the first counting period and the second counting period are equal.

3. The method of claim 2, wherein the performing anti-jitter processing on the second storage flag to obtain a third storage flag comprises:
in response to that the second storage flag corresponds to a count value within a preset jitter range of the second counter, adjusting the second storage flag to a position corresponding to any count value outside the jitter range in the second counting period for obtaining the third storage flag.

4. The method of claim 2, wherein the performing anti-jitter processing on the second storage flag to obtain a third storage flag comprises:
in response to that the second storage flag corresponds to a first count value outside the preset jitter range of the second counter, modifying the first count value corresponding to the second storage flag to a second count value, wherein the second count value is any count value within the jitter range; and
recounting the second counter by taking the second count value as a starting point for counting, adjusting the second storage flag to a position corresponding to a third count value to obtain the third storage flag, wherein the third count value is any count value outside the jitter range in the second counting period after the recounting.

5. The method of claim 1, further comprising:
after obtaining the first storage flag, performing delay processing on the first storage flag, so that the first storage flag is delayed for a time duration relating to the link delay from the digital pre-distortion circuit to the power amplifier.

6. The method of claim 5, further comprising:
in response to a first data acquisition clock and a second data acquisition clock synchronous with each other, acquiring the second data according to the first storage flag subjected to the delay processing.

7. The method of claim 1, wherein, in response to that a current type of data acquisition is configured to be digital pre-distortion data acquisition, the first data are downlink data and the second data are feedback data.

8. The method of claim 1, wherein, in response to that a current type of data acquisition is configured to be data acquisition for detecting a standing wave ratio, during acquisition of downlink data and feedback data, the first data are the downlink data and the second data are the feedback data; and during acquisition of downlink data and reflection data, the first data are the downlink data and the second data are the reflection data.

9. A data acquisition device, comprising a memory and a processor, the memory stores a computer program, the processor, when executes the computer program, performs the method of claim 1.

10. A non-transitory storage medium having a computer program stored thereon, the computer program, when executed by a processor, performs the method of claim 1.

11. A data acquisition apparatus, comprising:
a first obtaining module configured to obtain a first storage flag, the first storage flag is configured to indicate a flag bit at which first data starts to be acquired and stored;
a second obtaining module configured to, in response to that a first data acquisition clock is asynchronous with a second data acquisition clock, obtain a second storage flag according to the first data acquisition clock and the second data acquisition clock, the second storage flag is a storage flag bit corresponding to the first storage flag after the first storage flag crosses from the first data acquisition clock to the second data acquisition clock;
an anti-jitter processing module configured to perform anti-jitter processing on the second storage flag to obtain a third storage flag; and
a first acquisition module configured to acquire a second data according to the third storage flag, wherein, a delay between the first data and the second data acquired each time is kept unchanged,
wherein, a length of the delay is related to a link delay from a digital pre-distortion circuit to a power amplifier.

12. A data acquisition method, comprising:
obtaining a first storage flag, the first storage flag is configured to indicate a flag bit at which first data starts to be acquired and stored;
in response to a first data acquisition clock and a second data acquisition clock asynchronous with each other, obtaining a second storage flag according to the first data acquisition clock and the second data acquisition clock, the second storage flag is a storage flag bit corresponding to the first storage flag after the first storage flag crosses from the first data acquisition clock to the second data acquisition clock, and
performing anti-jitter processing on the second storage flag to obtain a third storage flag, and acquiring second data according to the third storage flag, wherein, a delay between the first data and the second data acquired each time is kept unchanged,
wherein in response to that a type of each data acquisition is configured to be digital pre-distortion data acquisition, the first data are downlink data and the second data are feedback data,
in response to that the type of each data acquisition is configured to be data acquisition for detecting a standing wave ratio, during acquisition of downlink data and feedback data, the first data are the downlink data and the second data are the feedback data; and during acquisition of downlink data and reflection data, the first data are the downlink data and the second data are the reflection data.

\* \* \* \* \*